US008238644B2

(12) United States Patent
Brunner et al.

(10) Patent No.: US 8,238,644 B2
(45) Date of Patent: Aug. 7, 2012

(54) FAST METHOD TO MODEL PHOTORESIST IMAGES USING FOCUS BLUR AND RESIST BLUR

(75) Inventors: Timothy A. Brunner, Ridgefield, NY (US); Gregg M. Gallatin, Newtown, CT (US); Ronald L. Gordon, North Borough, MA (US); Kafai Lai, Poughkeepsie, NY (US); Alan E. Rosenbluth, Yorktown Heights, NY (US); Nakgeuon Seong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 1640 days.

(21) Appl. No.: 11/378,536

(22) Filed: Mar. 17, 2006

(65) Prior Publication Data

US 2007/0224526 A1 Sep. 27, 2007

(51) Int. Cl.
*G06K 9/00* (2006.01)
(52) U.S. Cl. ..................................................... 382/144
(58) Field of Classification Search .................. None
See application file for complete search history.

(56) References Cited

U.S. PATENT DOCUMENTS

| 6,738,859 B2 * | 5/2004 | Liebchen ........................ 716/51 |
| 2006/0170899 A1 * | 8/2006 | De Kruif et al. ................ 355/69 |

OTHER PUBLICATIONS

A.E. Rosenbluth, G. Gallatin, R.L. Gordon, W. Hinsberg, J. Hoffnagle, F. Houle, K. Lai, A. Lvov, M. Sanchez, and N. Seong, "Fast Calculation of Images for High Numerical Aperture Lithography", SPIE v. 5377 Optical Microlithography XVII, (2004) pp. 615-628.*
N.B. Cobb, A. Zakhor, and E. Miloslavsky, "Mathematical and CAD Framework for Proximity Correction", in SPIE vol. 2726—Optical Microlithography IX, ed. Gene E. Fuller (SPIE, 1996), pp. 208-222.*
H. Gamo, "Matrix Treatment of Partial Coherence," in Progress in Optics v. 3, Emil Wolf (North Holland, 1964), pp. 238-243.
N.B. Cobb, A. Zakhor and . Miloslavsky, "Mathematical and CAD Framework for Proximity Correction," in SPIE vol. 2726—Optical Microlithography IX, ed. Gene E. Fuller (SPIE, 1996), pp. 208-222.
Y.C. Pati and T. Kailath, "Phase-shifting Masks for Microlithography: Automated Design and Mask Requirements," J. Opt. Soc. Am. A/vol. 11, No. 9 (1994): pp. 2438-2452.
A.E. Rosenbluth, G. Gallatin, R.L. Gordon, W. Hinsberg, J. Hoffnagle, F. Houle, K. Lai, A. Lvov, M. Sanchez and N. Seong, "Fast Calculation of Images for High Numerical Aperture Lithography," SPIE v. 5377 Optical Microlithography XVII, (2004) pp. 615-628.
J. Tirapu-Azpiroz, E. Yablonovitch, "Fast Evaluation of Photomask Near-Fields in Sub-Wavelength 193nm Lithography", Proceedings of SPIE, vol. 5377, 2004, pp. 1528-1535.

D.G. Flagello, A.E. Rosenbluth, "Lithographic Tolerances Based on Vector Diffraction Theory," J. Vac. Sci. Technol. B 10(6), 1992, pp. 2997-3003.
G. Gallatin, "High-Numerical-Aperture Scalar Imaging," Applied Optics vol. 40, No. 28, 2001, pp. 4958-4964.
D.G. Flagello, T. Milster, and A.E. Rosenbluth, "Theory of High-NA Imaging in Homogeneous Thin Films," J. Opt. Soc. Am. vol. 13, No. 1, 1996, pp. 53-64.
H.A. MacLeod, "Thin-Film Optical Filters,", Second Edition, 1986, pp. 10-70.
E. Goffman, G. Gallatin, K. Lai, M.A. Lavin, M. Mukherjee, D. Ramm, A.E. Rosenbluth, and S. Shlafman, "Method for Optimizing the Number of Kernels Used in A Sum of Coherent Sources for Proximity Correction in an Optical Microlithography Process," IL820030018, 17 pages, 2005.
K. Lai, A.E. Rosenbluth, M. Mukherjee, G.M. Gallatin, D. Ramm, M.A. Lavin, E. Gofman, and S. Shlafman,"Extending the Range of Lithographic Simulation Integrals to Include Intermediate Distance Scales," , 30 pages.
V. Magni, G. Cerullo, and S.D. Silvestri, "High-accuracy Fast Henkel Transform for Optical Beam Propagation," J. Opt. Soc. Am. A, vol. 9, No. 11 (1992): pp. 2031-2033.
R.L. Gordon and A.E. Rosenbluth, "Lithographic Image Simulation for the 21st Century With 19th Century Tools," in SPIE vol. 5182: Wave-Optical Systems Engineering II, ed. Frank Wyrowski, (2003): pp. 73-87.
R.M. Von Bunau, Y.C. Pati, Y.-T. Wang, and R.F.W. Pease, "Optical Coherent Decompositions for Radially Symmetric Optical Systems," J. Vac. Sci. Technol. B. 15(6), (1997): pp. 2412-2416.
D.S. Goodman and A.E. Rosenbluth, Condenser Aberrations in Kohler Illumination, SPIE vol. 922, (1988), pp. 1-26.
K Lai, I. LaLovic, R. Fair, A. Kroyan, C. Progler, N. Farrar, D. Ames and K. Ahmed, "Understanding Chromatic Aberration Impacts on Lithographic Imaging," J. Microelectronics, Microfabrication and Microsystems, (2003), p. 105-111.

* cited by examiner

*Primary Examiner* — Samir Ahmed
*Assistant Examiner* — Fred Hu
(74) *Attorney, Agent, or Firm* — DeLio & Peterson, LLC; Kelly M. Nowak; Wenjie Li

(57) ABSTRACT

A method for determining an image of a patterned object formed by a polychromatic lithographic projection system having a laser radiation source of a finite spectral bandwidth and a lens for imaging the patterned object to an image plane within a resist layer. The method comprises providing patterns for the object, a spectrum of the radiation source to be used in the lithographic projection system, an intensity and polarization distribution of the radiation source, and a lens impulse response in the spatial domain or in the spatial frequency domain of the image. The method then includes forming a polychromatic 4D bilinear vector kernel comprising a partially coherent polychromatic joint response between pairs of points in the spatial domain or in the spatial frequency domain, determining the dominant polychromatic 2D kernels of the polychromatic 4D bilinear vector kernel, and determining the image of the patterned object from convolutions of the object patterns with the dominant polychromatic 2D kernels.

22 Claims, No Drawings

FAST METHOD TO MODEL PHOTORESIST IMAGES USING FOCUS BLUR AND RESIST BLUR

BACKGROUND OF THE INVENTION

1. Field of the Invention

The present invention relates generally to lithographic production of microelectronic circuits or other features and, more particularly, to a method for simulating an image of a patterned object formed in a polychromatic lithographic projection system.

2. Description of Related Art

Simulation of lithography of microelectronic circuits and other features is increasing in importance as modern exposure and metrology tools increase in cost, and integrated circuit (IC) feature sizes drop well below the wavelength of light. The accurate simulation of lithographic processes can be used to eliminate many experiments, and there is huge cost incentive to do this whenever possible. Sub-100 nm features represent a significant challenge in the manufacture of ICs since such feature sizes approach the resolution limits of the lithographic imaging tools employed in IC fabrication. The practical difficulty as feature sizes shrink well below half the wavelength of light ($\lambda/2$) is not in avoiding a hard resolution limit, but rather in successfully printing the circuit patterns within an acceptable tolerance about the correct dimensions even as the exposing image departs substantially from an ideal binary pattern.

One technique adopted in the semiconductor industry to meet this challenge is model-based optical proximity correction (MB-OPC, or OPC for short), in which mask shapes are pre-distorted on the basis of process simulations in order that their dimensions, as printed on the wafer, achieve target values. Lithographic simulation becomes an explicit component of the manufacturing process when OPC is used. In recent years, the use of OPC software has increased dramatically, and is now vital to modern IC chip production. Unfortunately, the models used within this OPC software are difficult to adjust to actual processes because they contain many adjustable fitting parameters, and these parameters do not correspond to measurable physical quantities. The OPC modeling software is frequently not accurate, and is too slow. One specific aspect which has not been included in OPC software is the focus blur due to laser spectral bandwidth.

The ability to accurately simulate the lithographic exposure process, including the image projection and resist expose/develop steps, has wider importance beyond OPC. Narrow process margins make it necessary to optimize as many variables as possible during lithographic printing, and this optimization cannot be accomplished by trial-and-error or heuristic rules due to the complexity involved. The high cost of test masks and metrology for complex patterns makes accurate simulation particularly desirable.

An important additional challenge arises when simulation is carried out for OPC, due to the enormous number of image calculations that OPC programs must carry out to correct the roughly 1 E8 features in state-of-the-art circuit masks. Every adjustment of each individual feature requires that multiple intensity calculations be made in order to characterize the image in a finite neighborhood around the feature. In addition, these adjustments must usually be iterated in order to accommodate the interaction of each adjusted feature with its neighbors. Practical OPC is thus highly dependent on the ability to accurately simulate the behavior of the imaging system with great rapidity. Unfortunately, known methods for simulating the effect of finite source bandwidth in imaging systems are far too slow to be practical for OPC.

Earlier generations of lithography lenses were manufactured to much more relaxed tolerances than is currently acceptable, and by those standards such lenses usually achieved acceptably good chromatic correction over the full range of wavelengths present in the source. In this context fast simulation methods were developed based on the approximation of monochromatic imaging, making it possible to calculate optical intensities with a speed adequate for OPC so long as chromatic aberration could be neglected. For example, IC masks usually contain many blocks or cells of patterns that are replicated at multiple points within the exposure field, and this design hierarchy allows a set of OPC adjustments that have been computed for a given cell to be redeployed many times without significant additional computation.

Also, IC mask patterns are polygonal in shape, and the corner angles in these polygons are almost always restricted to a very limited set of specific values. For example, most mask features are so-called "Manhattan" polygons, in which all corner angles are 90°, and this limited set of corner possibilities allows OPC software to represent any mask polygon as a superposition of pre-analyzed corners. Though the imaging process is nonlinear, it can be represented as a quadratic superposition of linear steps, with each linear step taking the form of a convolution of the mask pattern with a particular kernel. If each polygon is represented as a superposition of corners, one can then carry out these polygon convolutions very rapidly once the convolution of each possible constituent corner and kernel has been pre-calculated and stored.

The photoresist on which the image is projected in a lithographic process responds to the square of the electric field, so the imaging process is inherently nonlinear; however the squaring operation entails little computational burden. More significantly, image formation is partially coherent in practical systems, and this substantially increases the computational burden during OPC. In a purely coherent system, the electric field at some given image point (conjugate to a particular mask point) can be calculated as a 2D convolution of field contributions from nearby mask points, with the convolution kernel involved being the amplitude response function of the lens. Likewise, a 2D convolution of intensity contributions will suffice to model a system that is effectively incoherent. However, partially coherent imaging is governed by a 4D bilinear amplitude convolution, in which the field contributed from each neighboring mask point will partially interfere with the field contributed by every other neighboring mask point to a degree determined by the separation between each such pair of neighboring points. This pairwise two-fold integration over the domain of a 2D mask requires a 4D integration.

For this reason partial coherence has significant speed implications for the elementary OPC operation of calculating intensity at a given point. If feature interactions within a region of width of, for example, 20 times the lens resolution are considered significant when calculating intensity (i.e. intensity at the center of the region), then an integration in 4D will entail a 400-fold increase in computation time over a simple 2D integration.

However, using the prior art Sum of Coherent Systems (SOCS) method, it is possible to adequately approximate the 4D integral as a truncated sum of 2D integrals, each of which is evaluated using the polygon convolution method described above. Typically about 10 2D integrals are employed in this sum, entailing roughly a 10-fold increase in computation over the 2D cases of purely coherent or purely incoherent imaging. This is considered acceptable for OPC, unlike the ~400-fold increase from direct 4D integration. The SOCS method thus makes it feasible to carry out OPC with imaging configurations that employ partially coherent illumination.

Unfortunately, an additional severe computational burden is imposed by adding the weighted contributions from many monochromatic exposures within the source spectrum to carry out an elementary intensity calculation in the polychromatic case. For example, if the source spectrum is approximated by its intensity at 20 grid points within the spectral bandwidth, then computation time increases 20-fold over the monochromatic partially coherent case when this prior-art polychromatic algorithm is used. Such an increase makes OPC completely impractical in almost all cases. While the increase can be cut in half when the spectrum and lens response are symmetrical about the center wavelength, considerably larger improvements are needed for practical usability.

In current lithographic simulations, the effect of chromatic aberration cannot be ignored, and an effective method to simulate imaging with polychromatic radiation is needed. The primary type of chromatic aberration introduces different defocus that varies linearly with the wavelength difference from the central wavelength of the spectrum. As a result, there is a net focus blurring of the final image. Other higher order aberration can be induced, depending on the detailed lens prescription. These kinds of imaging defects degrade process window, including depth of focus and exposure latitude of the imaging process. Besides the change in process window, the resulting focus blurring cause change in the optical proximity effect on imaging. This sensitivity of critical dimension (CD) to bandwidth reinforces the importance of modeling polychromatic imaging in real cases. In current lithography, a variability in CD of even 1 nm is significant, and a variability as large as 5 nm is often completely unacceptable.

Besides image quality degradation, chromatic aberration also introduces a variation in lateral magnification for each wavelength. When the center wavelength drifts a net magnification error is induced, which is considered a non-correctable error. All microlithography lasers have a finite bandwidth and are not unique from generation to generation, and from model to model. For accurate OPC with current ArF lithography lenses, it would be desirable to take chromatic aberration into account during image calculations, without incurring a significant penalty in execution time.

SUMMARY OF THE INVENTION

Bearing in mind the problems and deficiencies of the prior art, it is therefore an object of the present invention to provide an improved method for simulating and determining an image of a patterned object to be formed in a resist layer by a polychromatic lithographic projection system.

It is another object of the present invention to provide a method for simulating the effect of finite source bandwidth in polychromatic lithographic imaging systems that is practical for use with optical proximity correction modeling of object patterns.

A further object of the invention is to provide a method that improves accuracy and speed in simulating an image of a patterned object formed in a polychromatic lithographic projection system.

It is yet another object of the present invention to provide a method for modifying an image of a patterned object in two or more polychromatic lithographic projection systems that have different spectral bandwidths in such a way that the projection systems print patterns with as closely matched dimensions as possible.

It is a further object of the present invention to provide a method for modifying an image of a patterned object in one or more polychromatic lithographic projection systems such that, when the spectral bandwidth of the illumination changes, control settings in a projection system may be adjusted to minimize the change in the dimensions of printed patterns.

Still other objects and advantages of the invention will in part be obvious and will in part be apparent from the specification.

The above and other objects, which will be apparent to those skilled in the art, are achieved in the present invention which is directed to a method for determining an image of a patterned object formed by a polychromatic lithographic projection system, the projection system having a radiation source of a finite spectral bandwidth, for example, a laser, for illuminating the patterned object and a lens for imaging the patterned object to a planar image space including an image plane within a resist layer. The method comprises providing patterns for the object to be formed in the resist layer and printed, providing a spectrum of the radiation source to be used in the lithographic projection system, providing an intensity and polarization distribution of the radiation source, and providing a lens impulse response in the spatial domain or in the spatial frequency domain of the image for the lens to be used in the polychromatic lithographic projection system. The method then includes forming a polychromatic 4D bilinear vector kernel comprising a partially coherent polychromatic joint response between pairs of points in the spatial domain or in the spatial frequency domain, determining the dominant polychromatic 2D kernels of the polychromatic 4D bilinear vector kernel, and determining the image of the patterned object from convolutions of the object patterns with the dominant polychromatic 2D kernels.

The method is advantageously used where the planar image space is comprised of thin planar interference films. In such case, the polychromatic 4D bilinear vector kernel is preferably calculated using Hankel transforms of azimuthal Fourier interaction coefficients derived from the transfer coefficients of the thin interference films.

The method may further include using the polychromatic 2D kernels and determined image to adjust the object pattern, for example, by applying an optical proximity correction method to determine dimensions of the patterned object to be formed in the resist layer. When the polychromatic lithographic projection system is used to form the projected patterned objects in the resist layer disposed in the image space, the result is that the printed patterned objects are formed with specified, desired dimensions.

The aforedescribed method may be used to determine an image of the patterned objects formed by one or more additional polychromatic lithographic projection systems having finite spectral bandwidths that are not all identical. In such case, the method of the present invention may include subsequently adjusting control settings in the first and additional lithographic projection systems to match dimensions of the patterned objects formed in the resist layers of the projection systems.

The aforedescribed method may further be used to determine the images of the patterned object produced by a changed finite spectral bandwidth, and may include subsequently adjusting control settings in the lithographic projection system to minimize differences in dimension of the patterned objects formed in the resist layer by the changed spectral bandwidth.

DESCRIPTION OF THE PREFERRED EMBODIMENT(S)

The present invention provides an improved method for modeling or simulating patterned images to be produced by lithography systems using excimer and other polychromatic lasers. The invention simulates the image by accounting for spectral line width of the polychromatic laser, the finite thickness of photoresist and other focus blurring mechanisms. As a result of the method of the present invention, OPC may be efficiently carried out under simulated polychromatic imaging.

An important step in the method of the present invention is the calculation and tabulation of quantities that are referred to as polychromatic 2D imaging kernels. A kernel describes the fixed characteristics of a system which has varying inputs, where the system behavior can be described as an integral involving the input multiplied by the kernel. One version of the prior art monochromatic SOCS method is based on diagonalizing the so-called TCC matrix. In the case of polychromatic imaging, the TCCs can be calculated using the Equation:

$$T(\vec{W}_1, \vec{W}_2) = B(\vec{W}_1)B(\vec{W}_2)G(\vec{W}_2 - \vec{W}_1) \quad [1]$$

$$\iint d\vec{W}_S S(\vec{W}_S) H(\vec{W}_1 + \vec{W}_S) H^*(\vec{W}_2 + \vec{W}_S) F_L(\vec{W}_1 + \vec{W}_S,$$

$$\vec{W}_2 + \vec{W}_S) \sum_{m=1}^{m_{\text{Max}}} \vec{E}_m(\vec{W}_1 + \vec{W}_S; \vec{W}_S) \cdot \vec{E}_m^*(\vec{W}_2 + \vec{W}_S; \vec{W}_S).$$

The left side quantity $T(\vec{W}_1, \vec{W}_2)$ is the so-called TCC or transmission cross-coefficient function (also referred to as the Hopkins or C function), which describes the degree of interference between two different spatial frequencies. The TCC function represents the modulation level present in the interference fringes that are produced when the spatial-frequency content in the mask at frequency $\vec{W}_1$ (or, more precisely, the spatial frequency content that would diffract into projected direction $\vec{W}_1$ if the mask were illuminated at normal incidence) interferes with the mask spatial frequency content at frequency $\vec{W}_2$ (or again, the mask frequency content that would diffract into projected direction $\vec{W}_2$ under normally incident illumination). In an incoherent system these two frequencies would not interfere unless $\vec{W}_1 = \vec{W}_2$, while in a coherent system they would always produce interference fringes exhibiting complete constructive or destructive interference (if collected by the lens). However, in the general partially coherent case the fringe contrast takes on the intermediate value given by T.

In the equations herein, $\hat{W}$ and related symbols refer to directional unit vectors; more specifically the elements of vectors like $\hat{W}$ are the Cartesian direction cosines of the corresponding ray or plane-wave component. Customarily the x, y, z components of such propagation vectors are denoted by Greek letters $\alpha$, $\beta$, and $\gamma$ respectively, with the z-axis representing the direction of the optical axis. In Equation 1 a script-font $\vec{W}$ denotes the projection of a ray or plane-wave component onto the x, y plane of the mask (object) or wafer (image), i.e., $$\hat{W} \equiv \{\alpha, \beta, \gamma\} = \{\alpha, \beta, \sqrt{1-\alpha^2-\beta^2}\},$$

$$\vec{W} \equiv \{\alpha, \beta, 0\}. \quad [2]$$

The integration in Equation 1 thus takes place over a 2D directional domain, which can be understood as being either the directional domain of diffraction from the mask, or the conjugate image-space directional domain in which light is converged to the wafer.

In Equation 1, $\vec{E}_m(\vec{W}, \vec{W}_S)$ denotes the electric field produced at some specified depth in the resist film by the plane-wave component that is diffracted into direction $\vec{W}$ by each unit amplitude of the associated spatial frequency component in the mask patterns (except that scalar aberrations and apodization are by convention not included in $\vec{E}$). This association of direction with spatial frequency is based on the standard grating law, in which normally incident illumination (wavelength $\lambda$) is diffracted by a periodic structure (period P) into a first-harmonic direction-sine given by $\lambda/P$. Under illumination at normal incidence the spatial-frequency of this periodic mask component is the same as the projected diffraction direction $\vec{W}$ (see Equation 2). However, as indicated in Equation 1, when the illuminating direction is tilted (e.g., to a direction $\vec{W}_S$), the projected diffraction direction will be biased accordingly, i.e. to a direction $\vec{W} + \vec{W}_S$.

$\vec{E}_m(\vec{W}, \vec{W}_S)$ is given an additional dependence on $\vec{W}_S$ in its second argument (in this case an explicit dependence). This separate argument indicates that, in addition to the dependence of the image plane field on the polarization of the illumination, the magnitude of the diffracted intensity may in general depend in some arbitrary way on illumination angle (and for that matter on diffracted angle); however the method of the present invention imposes the important restriction that this angular dependence must be the same for all mask features, to within a linear functional (usually a Fourier transform) that by definition is omitted from $\vec{E}_m$. ($\vec{E}_m$ is by definition normalized against a unit amplitude of mask spatial frequency content after taking lens apodization and aberration into account; the specific spatial frequency content present in a given mask is taken into account by applying the TCCs to e.g. Fourier transforms of the mask patterns.)

This assumption of a linear dependence of diffraction efficiency on 2D feature shape (where the dependence is usually assumed to be a simple Fourier transform) is implicit in the use of a feature-independent TCC.

A more restrictive assumption is customarily made in prior art monochromatic OPC, namely, that diffraction intensity is entirely independent of illumination direction. This is one of a set of assumptions that are sometimes referred to as "thin mask approximations." Mask features may be pre-processed, e.g., on a per-edge basis, to approximately account for feature-dependent effects within the "thin mask" framework.

The dependence of $\vec{E}_m(\vec{W}, \vec{W}_S)$ on illumination direction can arise from customized source polarization, as well as from the geometry of non-negligible mask-side NA. Most lithography systems use unpolarized light, which can be treated as the uncorrelated sum of two orthogonal independent polarizations, distinguished here using subscript m. The two orthogonal illumination components each give rise to different fields $\vec{E}_m$ in the resist. (These two resist fields would themselves be orthogonal at every point if the imaging system and film stack were non-polarizing; however at high NA this may not be a good approximation.)

The intensity of the source in illuminating direction $\vec{W}_S$ is denoted by the term $S(\vec{W}_S)$. The term $H(\vec{W})$ denotes the pupil transmission function of the lens, generally a circle of radius NA/$n_c$, where $n_c$ denotes the refractive index of the medium between the lens and wafer. (In immersion lithography $n_c>1$.) Note that the components of $\vec{W}$ are defined as the geometrical direction cosines of a ray or plane-wave component, rather than as the components of the so-called k-vector, which will depend on refractive index. The term H($\vec{W}$) also includes a radiometric obliquity factor that is inherent to imaging optical systems whose magnification is different from one.

The function $F_L$ ($\vec{W}_1$, $\vec{W}_2$) denotes an integrated bilinear aberration function; $F_L$ is defined as $$F_L(\vec{W}_1,\vec{W}_2) \equiv \int d\lambda L(\lambda) e^{i[\Theta(\vec{W}_1;\lambda)-\Theta(\vec{W}_2;\lambda)]}, \quad [3]$$

where $\Theta(\vec{W},\lambda)$ denotes the wavefront aberration at pupil position $\vec{W}$ for source wavelength $\lambda$; L($\lambda$) gives the spectral distribution of the illumination to be used in the lithographic projection system. In the convention employed herein, the spectral function $F_L$ is used rather than pupil function H to account for all scalar aberrations, even those that are $\lambda$-independent. Condenser aberrations can be accounted for by using the source distribution appropriate to the field position of interest. Thus, Equation 3 permits interference of pairs of spatial frequencies to be analyzed under polychromatic conditions, where many wavelengths are present.

It has been found that in current lithography systems, the dominant aberration at the central wavelength is usually defocus, and defocus is generally the largest chromatic aberration. The approximation of pure defocus $F_L$, is considered in Equation 4, even though its only numerical advantage arises from the more broadly applicable assumption of radial symmetry; in the case of pure defocus $F_L$ becomes the 2D function:

$$F_L(W',W'') \equiv \int d\lambda L(\lambda) e^{ik_0 nC(\gamma'-\gamma'')\Delta z(\lambda)}, \text{ where } w' \equiv |\vec{W}'| \text{ and } w'' \equiv |\vec{W}''|. \quad [4]$$

Here $\gamma \equiv \sqrt{1-\alpha^2-\beta^2}$ (see Equation 2), and $\Delta z(\lambda)$ denotes the (approximately linear) dependence of defocus on wavelength (so that $F_L$ becomes essentially a Fourier transform at each W', W'' value). Parameter $k_0$ is defined as $2\pi/\lambda_0$, where $\lambda_0$ is the central wavelength of the spectrum (in vacuum).

Most current lithographic tools scan a slot-shaped instantaneous exposure field whose width along the scan direction is smaller than that of the exposed circuit level; thus the cumulative dose received at each point in the total exposed pattern is the integrated image of a fixed mask point as projected through all points across the width of the slot field. If the slot field is tilted along the scan direction, the image integration will thus include an additional convolution term in $\Delta z$ that can be folded into the Equations 3 and 4 integration that provides $F_L$. This image tilt can be readjusted whenever the laser bandwidth drifts, thereby modifying $F_L$ so as to maintain stable imaging performance as far as defocus is concerned. The impact of higher order chromatic aberrations and the impact of detailed source shape is more complicated, but an optimizer can determine the set of tool adjustments which best restore the printing characteristics of a suite of critical patterns once the polychromatic 2D imaging kernels derived below are made available for simulation of the critical exposures whose restoration is optimized.

Filter functions B($\vec{W}$) and G($\vec{W}$) represent linear blur terms in the object and image planes, respectively. For example, B may account for finite mask-writer resolution in a phenomenological way, while G can represent the effect of resist diffusion. For brevity these factors will be referred to as "blur" terms, but it should be noted that they can encompass a broad range of process factors. Parameter G in particular may be taken to represent a general (and perhaps empirical) influence kernel that incorporates an arbitrary set of non-local perturbations in resist behavior.

Factors such as customized source polarization and lens birefringence can be taken into account when calculating $\vec{E}_m$. For the purpose of carrying out rapid OPC calculations in the presence of chromatic aberration, it is usually sufficient to consider the vector imaging properties of a lens that is "ideal" in its polarization properties, where "ideal" refers to an approximate vector imaging model that has now become fairly standard in lithographic simulations.

In the model of "ideal" imaging, $\vec{E}_m$ ($\vec{W}$) is given by:

$$\vec{E}(\vec{W}';\vec{W}'_S) = (u_S + v_S)\hat{E}_0[\vec{W}'_S] - (\hat{E}_0[\vec{W}'_S]\cdot\hat{W}')[([u_S+v_S]-\gamma'[\tilde{u}_p+\tilde{v}_p])\hat{W}'+(\tilde{u}_p-\tilde{v}_p)\hat{W}'\hat{z}]. \quad [5]$$

Here the prime on vectors $\vec{W}'$ and $\hat{W}'$ refers to the image space between the lens and wafer, while the double-prime on $\gamma''$ denotes the resist film. In accordance with Equation 2, $\vec{W}'$ and $\hat{W}'$ are both defined in a 2D space where the z component is projected out. Note that $\hat{W}'=\hat{W}''$ since $\hat{W}$ is a unit vector (unlike $\vec{W}$).

The term $\hat{E}_0[\vec{W}'_S]$ represents the direction of light polarization along illuminating direction $\vec{W}'_S$. (The prime indicates that $\vec{W}'_S$ has been scaled to the image-space range of pupil directions.) Vector imaging calculations for lithography customarily make approximations that are essentially equivalent to treating $\hat{E}_0$ as a unit vector in the 2D space of $\vec{W}'$. Note that mask-side NA is fairly small, since lithography lenses usually demagnify by at least a factor of 4.

The variables u and v represent thin-film coefficients that define the transfer of an incident electric field into the wafer thin-film stack to a depth corresponding to some specified image plane within the resist layer. (Note that the u, v coefficients depend on angle of incidence and hence are functions of $\hat{W}'$.) Transfer into a general film stack is not governed by a single transmittance $\tau$ (even for light of pure S or P polarization); this is because the resist layer will in general contain an up-traveling wave reflected from the substrate in addition to the usual transmitted down-traveling wave. The amplitudes of these two waves (per unit incident amplitude) are referred to as v and u, respectively. S and P are standard symbols for the two eigenpolarization states of a thin film stack, namely polarization perpendicular to the plane of incidence (S), or parallel to the plane of incidence (P).

Standard thin-film methods may be used to calculate the u and v amplitudes, with some refinements that will now be explained. Separate calculations should be made for the S components ($u_S$ and $v_S$) and the P components ($u_p$ and $v_p$), and these calculations must be repeated over a range of incidence angles corresponding to the full lens NA. To carry out these calculations the film stack is divided into upper and lower substacks that are separated by the depth-plane within the resist at which the image is to be calculated. It is well known how to calculate the standard thin-film characteristic matrices for the upper substack (denoted $M_1$), the lower substack (denoted $M_2$), and thus the full stack matrix $M_{Tot} \equiv M_1 \cdot M_2$.

One then solves (in both S and P polarization) the following four linear equations for u and v (eliminating the supplementary unknowns $\rho_{tot}$ and $\tau_{tot}$):

$$\begin{pmatrix} 1+\rho_{tot} \\ Y_{inc}(1-\rho_{tot}) \end{pmatrix} = M_{tot} \begin{pmatrix} 1 \\ Y_{subs} \end{pmatrix} \tau_{tot} \qquad [6]$$

$$\begin{pmatrix} u+v \\ Y_{resist}(u-v) \end{pmatrix} = M_2 \begin{pmatrix} 1 \\ Y_{subs} \end{pmatrix} \tau_{tot},$$

where Y denotes the so-called thin-film admittance in either the incident, resist, or substrate media. (If the propagation angle [i.e. the angle with respect to the z axis] in the space is φ, the admittance Y is defined as n cos(φ) for S polarization, and as n/cos(φ) for P polarization, where n is the refractive index of the medium.)

These thin-film methods provide transfer coefficients for the component of the field that is parallel to the substrate, i.e., the tangential component. (This is because the equations (Equation 6) that are solved for these coefficients express the continuity of tangential components across interfaces.) To obtain transfer coefficients for the field vector as a whole variables $\tilde{u}_p$ and $\tilde{v}_p$ have been introduced in Equation 5 that are defined by $\tilde{u}_p \equiv u_p \gamma'/\gamma''$, $\tilde{v}_p \equiv v_p \gamma'/\gamma''$.

The TCC function in Equation 1 is four-dimensional (2D in each of its two arguments). To simplify this function for use in OPC, one follows the following procedure. First, the polychromatic operator T is approximated as a truncated sum of its eigenvector products:

$$T(\vec{W}_1, \vec{W}_2) \cong \sum_{j=1}^{J_{Max}} \eta_j \Upsilon_j^*(\vec{W}_1) \Upsilon_j(\vec{W}_2), \qquad [7]$$

where only the largest of the eigenvalues η ($J_{Max}$ in number) are retained in the sum. The functions $\Upsilon_j$ or their Fourier transforms are referred to as 2D polychromatic imaging kernels, though the simpler term "eigenvector" may be used for brevity. Typically $J_{Max} \sim 10$, but a more exact criterion can be defined on the basis of both accuracy and symmetry requirements, making sure, in the case where some eigenvalues are degenerate, that all eigenvectors having the same eigenvalue are included in the sum whenever one degenerate eigenvector from the set is included.

Next the eigenvectors $\Upsilon$ are Fourier transformed to obtain polychromatic kernels that are convolved with the basic constituent corners from which the mask polygons are composed. The convolution is the kernel applied to each point of input, and integrated, i.e., the summation of the output kernel contribution from each input point. In the common case of Manhattan geometries all corners have the same 90° shape. In that case the OPC software may calculate the intensity of an image at an arbitrary point $\vec{p}$ using $$I(\vec{p}) \cong \sum_{j=1}^{J_{Max}} \eta_j \left| \sum_{l=1}^{L} \kappa_l C_j(\vec{p} - \vec{r}_l) \right|^2. \qquad [8]$$

Here $C_j(\vec{r})$ denotes the convolution of the jth eigenvector with the elementary 90° corner, $\vec{r}_l$ is the position of the *l*th corner, and $\kappa_l$ is alternately +1 or −1, depending on the order in which the corner occurs when tracing the perimeter of the polygon that contains it. The sum over *l* includes all polygon corners within the vicinity of $\vec{r}$; this neighborhood of influence is sometimes called the region of interest (ROI), and is typically chosen to have width of order 10 times the lens resolution.

This $C_j(\vec{e})$ term provides polychromatic corner tables in the same format as the monochromatic tables that are conventionally used for OPC. Thus, the polychromatic tables provided by the present invention are suitable for use with standard OPC codes.

One drawback to the Equation 1 formulation is that it requires a 2D integration for each $\vec{W}_1, \vec{W}_2$ pair. This only affects the pre-computation phase of OPC; i.e. it imposes no additional burden on the time-intensive step in which OPC correction is actually carried out. Still, the time spent in pre-computation may not be negligible, particularly during so-called "model build" in which model conditions undergo many re-adjustments, so preferred embodiments of the invention employ additional steps to improve efficiency during the pre-calculation step. In the case of polychromatic imaging, the pre-computation phase often may be carried out more rapidly than with the TCC-based procedure explained above.

To do so, it is convenient to initially neglect the object and image blur terms represented in Equation 1 by B and G. The Hopkins-like Fourier transform of Equation 1 for B=G=1 is $$V_{No \atop Blur}(\vec{r}', \vec{r}'') \equiv j(\vec{r}' - \vec{r}'') \int d\lambda L(\lambda) \sum_{m=1}^{m_{Max}} \tilde{\vec{h}}_m(\vec{r}'; \lambda) \cdot \tilde{\vec{h}}_m^*(\vec{r}''; \lambda), \qquad [9]$$

where $$\tilde{\vec{h}}_m(\vec{r}, \lambda) \equiv \iint_{NA} d^2 \vec{W} H(\vec{W}) \vec{E}_m(\vec{W}) e^{i[2\pi \vec{W} \vec{r} + \Theta(\vec{W}; \lambda)]}. \qquad [10]$$

The term h is the impulse response of the lens used in the lithographic processing system. The tilde on the lens vector impulse response function $\vec{h}$ indicates that polychromatic imaging has been included. Position $\vec{r}$ is defined in dimensionless units that are normalized by $n_c/\lambda_0$. The term $j(\vec{r}'-\vec{r}'')$ denotes the complex degree of coherence between separated points on the mask. Assuming that diffraction efficiency of a given mask spatial frequency is, within the range of collected angles, approximately independent of illumination direction, the second-argument dependence of $\vec{E}_m$ on $\vec{W}_S$ may be eliminated when carrying out the source integration to obtain j.

Most lithographic exposures are made with unpolarized light, which is handled using Equations 5 and 9 by taking the sum over m to be a two-term sum over orthogonal values for the illumination polarization, e.g., with $\hat{E}_0=\hat{x}$ when m=1, and $\hat{E}_0=\hat{y}$ when m=2. After such a computation, Equation 5 becomes in the common case of unpolarized light:

$$\sum_{m=1}^{2} \vec{E}_m(\vec{W}') \cdot \vec{E}_m^*(\vec{W}'') \equiv D_0(W')D_0^*(W'') + \qquad [11]$$
$$D_1(W')D_1^*(W'')\cos[\theta'-\theta''] + D_2(W')D_2^*(W'')\cos[2(\theta'-\theta'')],$$

where

-continued $$D_0(W) \equiv \frac{1}{\sqrt{2}}([u_S + v_S] + [\tilde{u}_P + \tilde{v}_P]\gamma''), \quad [12]$$

$$D_1(W) \equiv [\tilde{u}_P - \tilde{v}_P]W,$$

$$D_2(W) \equiv \frac{1}{\sqrt{2}}([u_S + v_S] - [\tilde{u}_P + \tilde{v}_P]\gamma'').$$

Here $W$ and $\theta$ are essentially the polar coordinates of $\vec{W}$, i.e., $\vec{W} \equiv W \cos(\theta)\hat{x} + W \sin(\theta)\hat{y}$.

It is worth explicitly noting a useful special case of Equation 12, namely the "generic film stack" consisting of an ideally antireflected resist film (where, for example, the coupling index $n_c$ is taken to match the resist index), and an ideal substrate antireflection coating. In this "generic" case we have $$D_0(\overline{W}) = \frac{1+\gamma''}{\sqrt{2}}, \quad [13]$$

$$D_1(\overline{W}) = W,$$

$$D_2(\overline{W}) = \frac{1-\gamma''}{\sqrt{2}}.$$

Returning now to the more general case, we express the normalized position coordinate $\vec{r}$ in polar coordinates, $$\vec{r} \equiv r\cos(\psi)\hat{x} + r\sin(\psi)\hat{y}. \quad [14]$$

Then using the identity $$\int_0^{2\pi}\int_0^{2\pi} d\varphi_1\, d\varphi_2 e^{i[q_1\cos(\varphi_1)+q_2\cos(\varphi_2)]}\cos(n[\varphi_1 - \varphi_2 + \delta]) \equiv \quad [15]$$

$$4\pi^2(-1)^n J_n(q_1)J_n(q_2)\cos(n\delta)$$

one can separate the variables in the vector interference contribution to Equation 9. To completely separate the integral one must also establish the azimuthal dependence of the pupil transmission and aberration terms. In general, the circular shape of the pupil domain makes it natural to expand those factors in, e.g., Zernike polynomials. For purposes of OPC this step can usually be done in a particularly simple way, because in OPC one generally either neglects pupil apodization or treats it as purely radial, and likewise non-radially-symmetric aberrations are usually neglected. This latter assumption is justified both because of the very small magnitude of residual aberrations other than defocus in modern lithography lenses, and because residual aberration signatures show significant variation from tool to tool and across exposure fields, meaning that aberration-specific contributions to overall mask correction cannot be widely applied.

In contrast to other aberrations, defocus from chromatic aberration can be quite large (e.g. if $\lambda$ is in the tails of the spectral distribution), and moreover one can in accordance with the invention approximately maintain the effective aberration signature from chromatic aberration at a fixed condition that is equivalent to a particular spectral bandwidth, for example by adjusting such parameters as the lowest order in-situ-adjustable aberrations of the lens, the dose, the illumination directionality distribution, and the tilt of the image plane.

When $H$ and $\Theta$ can be assumed independent of azimuth, Equations 9 through 15 reduce after the azimuthal integration to $$V_{\substack{No \\ Blur}}(\vec{r}', \vec{r}'') \equiv j(\vec{r}' - \vec{r}'')\sum_{l=0}^{2}(-1)^l\cos[l(\psi' - \psi'')]F_{L,l}(r', r''), \quad [16]$$

where $$F_{L,l}(r', r'') \equiv \int d\lambda L(\lambda)H_l(r'; \lambda)H_l^*(r''; \lambda), \quad [17]$$

$$H_l(r; \lambda) \equiv HT_l[H(W)D_l(W)e^{i\Theta(W;\lambda)}] \quad [18]$$

and where $HT_l$ denotes the one-dimensional $l$th-order Hankel transform:

$$HT_l[f(W)] \equiv 2\pi \int_0^\infty W\, dW f(W)J_l(2\pi Wr). \quad [19]$$

Fast algorithms related to the fast Fourier transform (FFT) are available to calculate Hankel transforms. (For example, the method of Magni for zero-order transforms is readily adapted to the more general case of higher-order transforms.) Fast 1D transforms represent significant time savings over the alternative 2D integration in Equation 1. Each of the three Equation 17 wavelength integrations (i.e. for $l=0, 1, 2$) that are pre-calculated before applying Equation 16 will entail a similar computational burden to Equation 3. In terms of the overall computational burden involved in calculating the imaging kernels, a three-fold expansion of this one step is negligible.

A key benefit of the Equation 16 solution is that it involves only function evaluations, unlike the frequency-domain TCC Equation 1, which requires that a 2D source integral be carried out for every $\vec{W}_1, \vec{W}_2$ point in the 4D grid. This represents a very significant speed advantage over the direct TCC approach, though we should note that methods are available to reduce the 4D TCC grid to a 2D grid in rotationally symmetric systems, providing a limited degree of relief (but considerably less than that from eliminating the source integration altogether, as Equation 16 provides).

Equation 16 still does not include the effect of transverse "blur" in the object and image planes (unlike Equation 1). To efficiently incorporate blur terms, Equation 16 is first expanded in a truncated sum of products of its polychromatic eigenvectors:

$$V_{\substack{No \\ Blur}}(\vec{r}', \vec{r}'') \cong \sum_{j=1}^{J_{Max}} \eta_j \tilde{\Psi}_j^*(\vec{r}')\tilde{\Psi}_j(\vec{r}''), \quad [20]$$

with the tilde indicating blur-free eigenvectors. Fourier transforming each eigenvector obtains a close approximation to the blur-free TCCs:

$$T_{\substack{No \\ Blur}}(\vec{w}_1, \vec{w}_2) \cong \sum_{j=1}^{J_{Max}} \eta_j \tilde{Y}_j^*(\vec{w}_1)\tilde{Y}_j(\vec{w}_2). \quad [21]$$

These Fourier transforms can be carried out fairly quickly using 2D FFTs, and only about 10 polychromatic eigenvectors need be transformed.

In the spatial-frequency domain, transverse blur terms (object and image) may be incorporated into the TCCs using:

$$T(\vec{w}_1, \vec{w}_2) = B(\vec{w}_1)B(\vec{w}_2)G(\vec{w}_2 - \vec{w}_1)T_{\substack{No \\ Blur}}(\vec{w}_1, \vec{w}_2). \quad [22]$$

Equation 22 can then be expanded in its eigenvectors (per Equation 7), and then transformed back to the spatial domain (i.e., the electric field beyond the plane of the mask) to obtain the desired SOCS kernels. In most situations Equations 16 and 22 represent a very rapid method for calculating the TCCs for polychromatic imaging.

In cases where ROI is very large, it may be desirable to avoid the extra eigendecomposition step that is required in the Equations 20 to 22 method for incorporating blur. In the common case where $\vec{E}_m(\vec{W}_1) \cdot \vec{E}_m^*(\vec{W}_2)$ depends only on $\theta_1 - \theta_2$ (as in Equation 11), this can be accomplished by sampling the impulse response product occurring in Equation 9 at multiple separations d along a fixed axis (e.g. $\hat{x}$), and at multiple sampled wavelengths. We denote the tabulation of this quantity as f:

$$f_{\substack{No \\ Blur}}(a, b, d; \lambda) \equiv \tilde{h}_{\substack{m, No \\ Blur}}([a+d]\hat{x} + b\hat{y}; \lambda) \cdot \quad [23]$$

$$\tilde{h}_{\substack{m, No \\ Blur}}^*([a-d]\hat{x} + b\hat{y}; \lambda).$$

Image-plane blur can now be incorporated using fast 2D convolution at each sampled value of d and λ. (Object-plane blur can be included separately, before the calculation of $\vec{h}$.) The full 4D spectrally-varying function is then obtained from:

$$\tilde{h}_m(\vec{r}_1; \lambda) \cdot \tilde{h}_m^*(\vec{r}_2; \lambda) = f\left(\frac{r_1^2 - r_2^2}{2s}, \frac{r_1 r_2 \sin[\theta_1 - \theta_2]}{s}, \frac{s}{2}; \lambda\right), \text{ where } s \equiv |\vec{r}_1 - \vec{r}_2|. \quad [24]$$

When the coherence function $j(\vec{r}' - \vec{r}'')$ also depends only on $\theta' - \theta''$, it is possible to reduce the 4D eigendecomposition problem to a small number of 2D polychromatic eigendecomposition problems by exploiting radial symmetry.

In determining or simulating an image of a patterned object that is intended to be formed by the polychromatic lithographic projection system, detailed information concerning the finite spectral bandwidth should be known for the radiation source to be used to illuminate the patterned object. The information should include a spectrum of the radiation source and the intensity and polarization distribution of the radiation source. Likewise, detailed information should be known concerning the lens to be used for imaging the patterned object to a planar image space in a resist layer. This lens information includes the lens impulse response in the spatial domain of the image or in the spatial frequency domain of the image (i.e., the map of the strength of the different plane waves emanating from the pupil of the lens), as described for example in connection with Equation 10. The method then requires the identification of the patterns to be used in creating the aerial image of the object to be projected onto the resist layer, whether by projection through a photomask or alternatively by maskless projection using light valves.

As described above, the method of the present invention calculates the polychromatic 4D bilinear vector kernel of Equations 1 and 22, comprising a partially coherent polychromatic joint response between pairs of points in the spatial domain or in the spatial frequency domain of the image, to translate a scalar quantity of mask transmission into a scalar quantity of exposure dose for polychromatic projection systems. As described in connection with Equation 22, the mask transmission can be made to take into account the finite resolution with which the object patterns are delineated, and the calculated exposure dose can take into account blurring from resist diffusion. Then, the dominant polychromatic 2D kernels of the polychromatic 4D bilinear vector kernel are determined, as described in Equation 7. Finally, the image of the patterned object is determined from convolutions of the object patterns with the dominant polychromatic 2D kernels, as described in Equation 8. This then provides the intensity of the image to be projected by the polychromatic radiation of the system at each desired point. The method is particularly useful where the planar image space is comprised of thin planar interference films. Standard optical proximity correction algorithms (implemented in standard computer programs) may then be applied to the simulated image of the patterned object to determine any corrections that need to be applied to dimensions of the patterned object in order for the desired circuit feature or other object to be correctly formed in the resist layer and printed on the wafer with the desired specified dimensions.

With the formulation of including focus blurring in a SOCS-like simulation algorithm, the method of the present invention permits not only the simulation of the effect of laser bandwidth and OPC on mask design but, because of its speed advantage, may also be used to determine optimum exposure tool parameters. Because of the sensitivity of proximity effect due to bandwidth change or other form of focus blurring, lithographic parameters may be optimized to give a requested CD proximity behavior. An example of this is the compensation of laser bandwidth differences between exposure tools.

A number of lithographic methods may employ the above-described analysis and method. To improve lithographic processes in which exposure tools have appreciable spectral bandwidth, the present invention permits one to use the images determined or simulated from convolutions of the object patterns with the dominant polychromatic 2D kernels in order to adjust mask pattern shapes to successfully print circuit patterns that have the shapes desired. A related method uses the polychromatic 2D imaging kernels in an optimizer that analyzes the determined pattern images to obtain mask features whose printed shapes will match the desired circuit patterns to within acceptable tolerances over as large a range of process variations as possible. Simulated images using the polychromatic 2D imaging kernels can be checked for expected successful fabrication of circuit patterns prior to actually undertaking costly production or pre-production experiments. The image simulations using the polychromatic 2D imaging kernels can be used for tool matching, i.e., they can be used to determine the set of adjustments in a polychromatic lithographic exposure tool which will best correct any small differences that may be observed in the printing characteristics of that tool compared to the characteristics of other tools or a reference tool. The polychromatic 2D imaging kernels may also be used in pattern image simulations to determine the set of exposure tool adjustments that will best compensate for small drifts in tool performance, in order to approximately maintain stable printing characteristics.

The method of the present invention for determining an image of a patterned object formed by a polychromatic lithographic projection system, including the use of optical proximity correction methods, may be implemented by a computer program or software incorporating the process steps and instructions described above in otherwise conventional program code and stored on an otherwise conventional program storage device. The program code, as well as any input information required, may be stored in the computer on a program storage device such as a semiconductor chip, a read-only memory, magnetic media such as a diskette or computer hard drive, or optical media such as a CD or DVD ROM. The computer system has a microprocessor for reading and executing the stored program code in device in the manner described above.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for determining an image of a patterned object formed by a polychromatic lithographic projection system, the projection system having a radiation source of a finite spectral bandwidth for illuminating the patterned object and a lens for imaging the patterned object to a planar image space including an image plane within a resist layer, the method comprising:
   providing patterns for the object;
   providing a spectrum of the radiation source to be used in the lithographic projection system;
   providing an intensity and polarization distribution of the radiation source;
   providing a lens impulse response in a spatial domain or in a spatial frequency domain of the image;
   forming a polychromatic 4D bilinear vector kernel comprising a partially coherent polychromatic joint response between pairs of points in the spatial domain or in the spatial frequency domain, the polychromatic 4D bilinear vector kernel translating a scalar quantity of mask transmission into a scalar quantity of exposure dose;
   determining dominant polychromatic 2D kernels of the polychromatic 4D bilinear vector kernel; and
   determining the image of the patterned object by providing the intensity of the image to be projected at each desired point across the spectrum of the radiation source from convolutions of the object patterns with the dominant polychromatic 2D kernels.

2. The method of claim 1 wherein the planar image space is comprised of thin planar interference films.

3. The method of claim 2 wherein the polychromatic 4D bilinear vector kernel is calculated using Hankel transforms of azimuthal Fourier interaction coefficients derived from transfer coefficients of the thin interference films.

4. The method of claim 1 wherein a laser is used as the radiation source in the lithographic process.

5. The method of claim 1 further including using the determined image to adjust the object pattern such that, when the polychromatic lithographic projection system is used to form the projected patterned objects in the resist layer disposed in the image space, the printed patterned objects are formed with specified dimensions.

6. The method of claim 1 further including applying an optical proximity correction method to the determined image of the patterned object to determine dimensions of the patterned object to be formed in the resist layer.

7. The method of claim 1 further including using the polychromatic 2D kernels with an optical proximity correction computer program to adjust the object pattern such that, when the polychromatic lithographic projection system is used to form the projected patterned objects in the resist layer disposed in the image space, the printed patterned objects are formed with specified dimensions.

8. The method of claim 1 further including using the method steps to determine an image of the patterned objects formed by one or more additional polychromatic lithographic projection systems having finite spectral bandwidths that are not all identical, and subsequently adjusting control settings in the first and additional lithographic projection systems to match dimensions of the patterned objects formed in the resist layers of the projection systems.

9. The method of claim 1 further including using the method steps to determine the images of the patterned object produced by a changed finite spectral bandwidth, and subsequently adjusting control settings in the lithographic projection system to minimize differences in dimension of the patterned objects formed in the resist layer by the changed spectral bandwidth.

10. A method for determining an image of a patterned object formed by a polychromatic lithographic projection system, the projection system having a radiation source of a finite spectral bandwidth for illuminating the patterned object and a lens for imaging the patterned object to a planar image space comprised of thin planar interference films including an image plane within a resist layer, the method comprising:
    providing patterns for the object;
    providing a spectrum of the radiation source to be used in the lithographic projection system;
    providing an intensity and polarization distribution of the radiation source;
    providing a lens impulse response in a spatial domain or in a spatial frequency domain of the image;
    forming a polychromatic 4D bilinear vector kernel comprising a partially coherent polychromatic joint response between pairs of points in the spatial domain or in the spatial frequency domain, the polychromatic 4D bilinear vector kernel being calculated using Hankel transforms of azimuthal Fourier interaction coefficients derived from transfer coefficients of the thin interference films;
    determining dominant polychromatic 2D kernels of the polychromatic 4D bilinear vector kernel; and
    determining the image of the patterned object from convolutions of the object patterns with the dominant polychromatic 2D kernels by providing the intensity of the image to be projected at each desired point across the spectrum of the radiation source.

11. The method of claim 10 wherein a laser is used as the radiation source in the lithographic process.

12. The method of claim 10 further including using the determined image to adjust the object pattern such that, when the polychromatic lithographic projection system is used to form the projected patterned objects in the resist layer disposed in the image space, the printed patterned objects are formed with specified dimensions.

13. The method of claim 10 further including applying an optical proximity correction method to the determined image of the patterned object to determine dimensions of the patterned object to be formed in the resist layer.

14. The method of claim 10 further including using the polychromatic 2D kernels with an optical proximity correction computer program to adjust the object pattern such that, when the polychromatic lithographic projection system is used to form the projected patterned objects in the resist layer disposed in the image space, the printed patterned objects are formed with specified dimensions.

15. The method of claim 10 further including using the method steps to determine an image of the patterned objects formed by one or more additional polychromatic lithographic projection systems having finite spectral bandwidths that are not all identical, and subsequently adjusting control settings in the first and additional lithographic projection systems to match dimensions of the patterned objects formed in the resist layers of the projection systems.

16. The method of claim 10 further including using the method steps to determine the images of the patterned object produced by a changed finite spectral bandwidth, and subsequently adjusting control settings in the lithographic projection system to minimize differences in dimension of the patterned objects formed in the resist layer by the changed spectral bandwidth.

17. A method for determining an image of a patterned object formed by a polychromatic lithographic projection system, the projection system having a radiation source of a finite spectral bandwidth for illuminating the patterned object and a lens for imaging the patterned object to a planar image space including an image plane within a resist layer, the method comprising:
   providing patterns for the object;
   providing a spectrum of the radiation source to be used in the lithographic projection system;
   providing an intensity and polarization distribution of the radiation source;
   providing a lens impulse response in a spatial domain or in a spatial frequency domain of the image;
   forming a polychromatic 4D bilinear vector kernel comprising a partially coherent polychromatic joint response between pairs of points in the spatial domain or in the spatial frequency domain;
   determining dominant polychromatic 2D kernels of the polychromatic 4D bilinear vector kernel;
   determining the image of the patterned object from convolutions of the object patterns with the dominant polychromatic 2D kernels by providing the intensity of the image to be projected at each desired point across the spectrum of the radiation source; and
   using the polychromatic 2D kernels with an optical proximity correction program to adjust the object pattern such that, when the polychromatic lithographic projection system is used to form the projected patterned objects in the resist layer disposed in the image space, the printed patterned objects are formed with specified dimensions.

18. The method of claim 17 wherein the planar image space is comprised of thin planar interference films, and wherein the polychromatic 4D bilinear vector kernel is calculated using Hankel transforms of azimuthal Fourier interaction coefficients derived from transfer coefficients of the thin interference films.

19. The method of claim 17 further including using the method steps to determine an image of the patterned objects formed by one or more additional polychromatic lithographic projection systems having finite spectral bandwidths that are not all identical, and subsequently adjusting control settings in the first and additional lithographic projection systems to match dimensions of the patterned objects formed in the resist layers of the projection systems.

20. The method of claim 17 further including using the method steps to determine the images of the patterned object produced by a changed finite spectral bandwidth, and subsequently adjusting control settings in the lithographic projection system to minimize differences in dimension of the patterned objects formed in the resist layer by the changed spectral bandwidth.

21. A method of simulating an image of a patterned object formed by a polychromatic lithographic projection system comprising:
   providing a projection system having a light source with a spectral bandwidth to illuminate the patterned object and a lens for imaging the patterned object, the spectral bandwidth of the light source having a spectrum of wavelengths;
   providing a lens impulse response of a map of strength of different plane waves emanating from a pupil of the lens;
   translating a scalar quantity of mask transmission into a scalar quantity of exposure dose by calculating a polychromatic 4D bilinear vector kernel using the lens impulse response and the spectral bandwidth of the light source at multiple wavelengths across the spectrum of wavelengths;
   determining the dominant polychromatic 2D kernels of the polychromatic 4D bilinear vector kernel; and
   determining a simulated image of the patterned object from convolutions of the object patterns with the dominant polychromatic 2D kernels by providing an intensity of the simulated image to be projected by the light source at each desired point across the spectrum of wavelengths of the spectral bandwidth.

22. The method of claim 21 further including applying optical proximity correction to the simulated image of the patterned object to determine any corrections needed for applying to the dimensions of the patterned object to be formed in a resist layer.

* * * * *